US008390363B2

(12) United States Patent
Engl

(10) Patent No.: US 8,390,363 B2
(45) Date of Patent: Mar. 5, 2013

(54) CIRCUIT, TRIM AND LAYOUT FOR TEMPERATURE COMPENSATION OF METAL RESISTORS IN SEMI-CONDUCTOR CHIPS

(75) Inventor: Bernhard Helmut Engl, Steinhöring (DE)

(73) Assignee: Linear Technology Corporation, Milpitas, CA (US)

( * ) Notice: Subject to any disclaimer, the term of this patent is extended or adjusted under 35 U.S.C. 154(b) by 222 days.

(21) Appl. No.: 12/991,540

(22) PCT Filed: Nov. 25, 2008

(86) PCT No.: PCT/US2008/084679

§ 371 (c)(1), (2), (4) Date: Nov. 8, 2010

(87) PCT Pub. No.: WO2010/062285

PCT Pub. Date: Jun. 3, 2010

(65) Prior Publication Data

US 2011/0068854 A1 Mar. 24, 2011

(51) Int. Cl.

*H01L 35/00* (2006.01)
*H01L 37/00* (2006.01)
*H03K 3/42* (2006.01)
*H03K 17/78* (2006.01)

(52) U.S. Cl. .......... 327/512; 327/513; 327/83; 327/138; 327/262; 327/378; 330/289

(58) Field of Classification Search .................. 327/512, 327/513, 83, 138, 262, 378; 330/289

See application file for complete search history.

(56) References Cited

U.S. PATENT DOCUMENTS

| | | | | |
|---|---|---|---|---|
| 4,317,054 | A * | 2/1982 | Caruso et al. | 327/539 |
| 4,795,961 | A * | 1/1989 | Neidorff | 323/314 |
| 6,232,828 | B1 * | 5/2001 | Smith et al. | 327/539 |
| 6,288,664 | B1 * | 9/2001 | Swanson | 341/155 |
| 6,310,518 | B1 * | 10/2001 | Swanson | 330/282 |
| 6,369,740 | B1 * | 4/2002 | Swanson | 341/155 |
| 6,414,619 | B1 * | 7/2002 | Swanson | 341/155 |
| 7,019,584 | B2 * | 3/2006 | Bartel et al. | 327/539 |
| 7,158,412 | B2 * | 1/2007 | Rodgers et al. | 365/185.18 |
| 7,502,264 | B2 * | 3/2009 | Rodgers et al. | 365/185.18 |
| 8,085,029 | B2 * | 12/2011 | Dobkin | 323/314 |
| 2002/0021116 | A1 * | 2/2002 | Sirito-Olivier | 323/316 |
| 2004/0178846 | A1 * | 9/2004 | Kuyel et al. | 330/9 |
| 2005/0110476 | A1 | 5/2005 | Mukherjee et al. | |
| 2005/0168270 | A1 * | 8/2005 | Bartel et al. | 327/539 |

(Continued)

FOREIGN PATENT DOCUMENTS

DE 10 2006 044 662 A1 4/2008

*Primary Examiner* — Adam Houston

(74) *Attorney, Agent, or Firm* — McDermott Will & Emery LLP

(57) ABSTRACT

A temperature compensation circuit for generating a temperature compensating reference voltage ($V_{REF}$) may include a Bandgap reference circuit configured to generate a Bandgap reference voltage ($V_{BGR}$) that is substantially temperature independent and a proportional-to-absolute-temperature reference voltage ($V_{PTAT}$) that varies substantially in proportion to absolute temperature. The circuit may also include an operational amplifier that is connected to the Bandgap reference circuit and that has an output on which $V_{REF}$ is based. The circuit may also include a feedback circuit that is connected to the operational amplifier and to the Bandgap reference circuit and that is configured so as to cause $V_{REF}$ to be substantially equal to VPTAT times a constant k1, minus VBGR times a constant k2.

36 Claims, 9 Drawing Sheets

U.S. PATENT DOCUMENTS

2005/0281115 A1* 12/2005 Rodgers et al. ............... 365/226
2006/0043957 A1 3/2006 Carvalho
2007/0052405 A1 3/2007 Mochizuki et al.
2007/0115009 A1* 5/2007 Graefling ...................... 324/721
2007/0241833 A1* 10/2007 Nervegna ...................... 331/176
2007/0296392 A1 12/2007 Chen et al.
2008/0037325 A1* 2/2008 Rogers et al. ............ 365/185.18
2008/0054995 A1 3/2008 Lin
2008/0116875 A1 5/2008 Ma
2008/0238400 A1* 10/2008 Dobkin ......................... 323/313
2009/0067471 A1* 3/2009 Goto et al. ....................... 374/10
2009/0172242 A1* 7/2009 Piasecki ........................ 710/317
2011/0068854 A1* 3/2011 Engl ............................. 327/512
2011/0187445 A1* 8/2011 Sicard ........................... 327/539
2012/0092064 A1* 4/2012 Floyd ............................ 327/543

* cited by examiner

FIG. 3

| TRIM SETTING | R213/R211 |
|---|---|
| 0 | 5.19 |
| 1 | 5.21 |
| 2 | 5.23 |
| 3 | 5.25 |
| 4 | 5.28 |
| 5 | 5.30 |
| 6 | 5.32 |
| 7 | 5.34 |
| 8 | 5.37 |
| 9 | 5.39 |
| A | 5.41 |
| B | 5.43 |
| C | 5.46 |
| D | 5.48 |
| E | 5.50 |
| F | 5.52 |

301

| TRIM SETTING | R221/R223 |
|---|---|
| 0 | 11.46 |
| 1 | 12.37 |
| 2 | 13.42 |
| 3 | 14.66 |
| 4 | 16.13 |
| 5 | 17.90 |
| 6 | 20.08 |
| 7 | 22.83 |

405

FIG. 4b

| TC1 @300K [ppm/K] | TRIM SETTING 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 3675 | 7 | 7 | 7 | 7 | 7 | 7 | 7 | 7 | 7 | 7 | 7 | 7 | 7 | 6 | 6 | 6 |
| 3700 | 6 | 6 | 6 | 6 | 6 | 6 | 6 | 6 | 6 | 6 | 6 | 6 | 6 | 6 | 6 | 6 |
| 3725 | 6 | 6 | 6 | 6 | 6 | 6 | 6 | 6 | 6 | 6 | 6 | 6 | 5 | 5 | 5 | 5 |
| 3750 | 5 | 5 | 5 | 5 | 5 | 5 | 5 | 5 | 5 | 5 | 5 | 5 | 5 | 5 | 5 | 5 |
| 3775 | 5 | 5 | 5 | 5 | 5 | 5 | 5 | 5 | 5 | 5 | 5 | 4 | 4 | 4 | 4 | 4 |
| 3800 | 4 | 4 | 4 | 4 | 4 | 4 | 4 | 4 | 4 | 4 | 4 | 4 | 4 | 4 | 4 | 4 |
| 3825 | 4 | 4 | 4 | 4 | 4 | 4 | 4 | 4 | 4 | 4 | 4 | 3 | 3 | 3 | 3 | 3 |
| 3850 | 4 | 3 | 3 | 3 | 3 | 3 | 3 | 3 | 3 | 3 | 3 | 3 | 3 | 3 | 3 | 3 |
| 3875 | 3 | 3 | 3 | 3 | 3 | 3 | 3 | 3 | 3 | 3 | 3 | 2 | 2 | 2 | 2 | 2 |
| 3900 | 3 | 3 | 2 | 2 | 2 | 2 | 2 | 2 | 2 | 2 | 2 | 2 | 2 | 2 | 2 | 2 |
| 3925 | 2 | 2 | 2 | 2 | 2 | 2 | 2 | 2 | 2 | 2 | 2 | 2 | 1 | 1 | 1 | 1 |
| 3950 | 2 | 2 | 2 | 2 | 1 | 1 | 1 | 1 | 1 | 1 | 1 | 1 | 1 | 1 | 1 | 1 |
| 3975 | 1 | 1 | 1 | 1 | 1 | 1 | 1 | 1 | 1 | 1 | 1 | 1 | 1 | 1 | 0 | 0 |
| 4000 | 1 | 1 | 1 | 1 | 1 | 1 | 0 | 0 | 0 | 0 | 0 | 0 | 0 | 0 | 0 | 0 |

401

403

FIG. 4a

CIRCUIT, TRIM AND LAYOUT FOR TEMPERATURE COMPENSATION OF METAL RESISTORS IN SEMI-CONDUCTOR CHIPS

RELATED APPLICATIONS

This application is the U.S. National Phase under 35 U.S.C. §371 of International Application No. PCT/US2008/084679, filed on Nov. 25, 2008, the disclosure of which Application is incorporated by reference herein.

BACKGROUND

1. Technical Field

This disclosure relates to temperature compensation of metal resistors embodied in semi-conductor chips. More specifically, this disclosure relates to circuits for generating a temperature compensating reference voltage, as well as layouts and trimming techniques for such circuits.

2. Description of Related Art

Metal resistors are used in semi-conductor chips for a variety of purposes. In some applications, the metal resistor serves to sense an operating parameter of the circuit, such as the amount of current that is being delivered to a battery while it is being charged and/or removed from it while it is being used.

The resistance of metal resistors typically fluctuates as a function of temperature. Such changes typically occur because of heat generated by the metal resistor, by other components, and/or by other sources. These temperature-dependent deviations in the resistance of the metal resistor can adversely affect the accuracy of its sensing and, in turn, the performance of related circuit functions.

One approach to addressing this issue has been to apply a temperature-compensating voltage to an appropriate point in the circuit to compensate for variations in the resistance of the metal, resistor as a function of temperature. As the resistance increases because of increasing temperature, so does the compensating voltage. When applied appropriately, the temperature-compensating voltage can reduce errors that would otherwise be caused by temperature deviations in resistance.

One typical approach for generating a temperature-compensating voltage is to use what is known as a delta Vbe voltage reference circuit. Such a circuit generates a voltage that varies in proportion to absolute temperature, i.e., a proportional-to-absolute-temperature ("PTAT") voltage. Unfortunately, PTAT voltages typically have a temperature-dependent curve which, when extrapolated, reaches zero volts at 0 Kelvin. The resistance of metal resistors, on the other hand, typically has a temperature-dependent curve which, when extrapolated, reaches zero ohms other than at 0 Kelvin. These differences in zero crossing locations can reduce the ability of a PTAT voltage to accurately compensate for deviations in the resistance of a metal resistor caused by temperature variations.

SUMMARY

A temperature compensation circuit may generate a temperature compensating reference voltage ($V_{REF}$). The circuit may include a Bandgap reference circuit configured to generate a Bandgap reference voltage ($V_{BGR}$) that is substantially temperature independent. The Bandgap reference circuit may also be configured to generate a proportional-to-absolute-temperature reference voltage ($V_{PTAT}$) that varies substantially in proportion to absolute temperature. The temperature compensation circuit may also include an operational amplifier that is connected to the Bandgap reference circuit and that has an output on which $V_{REF}$ is based. The temperature compensation circuit may also include a feedback circuit that is connected to the operational amplifier and to the Bandgap reference circuit. The feedback circuit may be configured to cause $V_{REF}$ to be substantially equal to $V_{PTAT}$ times a constant k1, minus $V_{BGR}$ times a constant k2.

A temperature-compensated semiconductor chip may include a metal resistor within the semiconductor chip. A temperature compensation circuit may also be within the semiconductor chip configured to generate a temperature compensating reference voltage ($V_{REF}$) that substantially compensates for variations in the resistance of the metal resistor as a function of temperature. The temperature compensation circuit may be of the type discussed above.

A process may trim a semiconductor chip to compensate for anticipated variations in the resistance of a metal resistor that is within the semiconductor chip as a function of temperature. The semiconductor chip may include an operational amplifier and a feedback circuit with a trimming device that is connected to the operational amplifier. The process may include trimming the trimming device in the feedback circuit so as to maximize the ability of a reference voltage ($V_{REF}$) to compensate for variations in the resistance of the metal resistor as a function of temperature.

A temperature compensation circuit for generating a temperature compensating reference voltage ($V_{REF}$) may include means for generating a Bandgap reference voltage ($V_{BGR}$) that is substantially temperature independent and a proportional-to-absolute-temperature reference voltage ($V_{PTAT}$) that varies substantially in proportion to absolute temperature. The circuit may include means for causing VREF to be substantially equal to VPTAT times a constant k1, minus VBGR times a constant k2 which may include a feedback circuit connected to an operational amplifier.

BRIEF DESCRIPTION OF DRAWINGS

The drawings disclose illustrative embodiments. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it is intended to refer to the same or like components or steps.

FIG. 3 is a table mapping settings of a trimming device in a Bandgap reference circuit to ratios of resistors in the Bandgap reference circuit.

FIG. 4(*a*) is a table mapping temperature coefficient values of a metal resistor and trimming device settings in a Bandgap reference circuit to trimming device settings in a feedback circuit.

FIG. 4(*b*) is a table mapping settings of a trimming device in a feedback circuit to resistor ratios in the feedback circuit.

DETAILED DESCRIPTION OF ILLUSTRATIVE EMBODIMENTS

Figure 1:
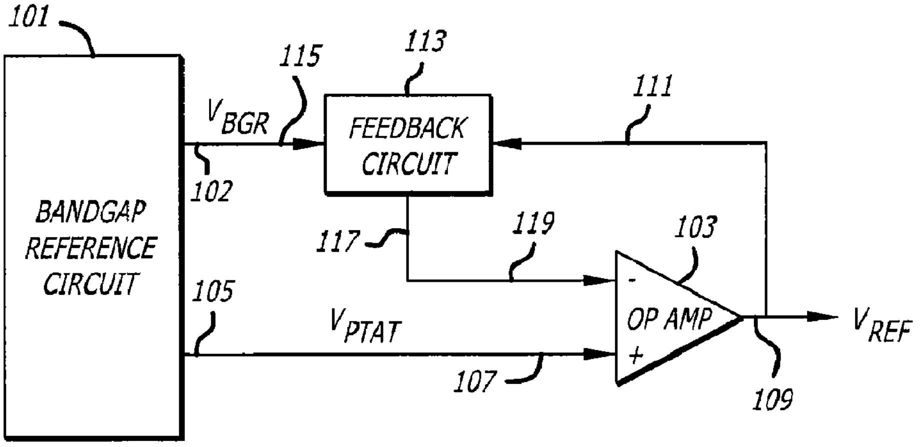
FIG. 1 is a block diagram of a temperature compensation circuit for generating a temperature compensating reference voltage.

Illustrative embodiments are now discussed. Other embodiments may be used in addition or instead. Details that may be apparent or unnecessary may be omitted to save space or for a more effective presentation. Conversely, some embodiments may be practiced without all of the details that are disclosed.

The variation in resistances of a non-magnetic metal as a function of temperature may be approximated by the following equation:

$$R(T) = R(T_{Debye}) \cdot \frac{T - 0.15 \cdot T_{Debye}}{0.85 \cdot T_{Debye}} \quad \text{(Eq. 1)}$$

wherein T is absolute temperature and $T_{Debye}$ is the Debye temperature of the metal, a material property of the metal which does not change over temperature.

Sputtered metal resistors may not adhere precisely to Eq. (1). However, their temperature coefficients may still strongly be related to their Debye temperatures, and any measured and fitted Spice TC1s can be mapped to corresponding Debye temperatures, so the approach may remain valid.

Based on Ohm's Law, the current which travels through a resistor may remain constant over varying temperatures, if the voltage which is applied to the resistor changes in proportion to changes in the resistance of the resistor as a function of temperature, i.e., $V_{REF}(T) \sim R(T)$. Based on this principle, Eq. (1) may be manipulated to yield:

$$V_{REF}(T) \sim T - 0.15 \cdot T_{Debye} \quad \text{(Eq. 2)}$$

Introducing thermal voltage $$V_{TH} = \frac{k}{q} \cdot T,$$

where k is Boltzmann's constant and q is the Elementary Charge into Eq. 2 yields $$V_{REF}(T) \sim V_{TH}(T) - 0.15 \cdot V_{TH}(T_{Debye}) \quad \text{(Eq. 3)}$$

It may thus be seen from Eq. (3) that a PTAT voltage $V_{TH}$ from which a smaller constant voltage is subtracted may yield the required compensating reference voltage. This may be because $0.15 \cdot T_{Debye}$ for the metal in question may always be much smaller than the temperature T at which the circuit is operated.

The small constant voltage may be generated by dividing a Bandgap voltage $V_{BGR}$ by a coefficient b and having another coefficient a for the proportionality. Eq. (3) may then be rewritten as:

$$V_{REF}(T) = a \cdot V_{TH}(T) - \frac{V_{BGR}}{b} \quad \text{(Eq. 4)}$$

In which $V_{TH}(T)$ represents a PTAT voltage which is proportional to absolute temperature and in which $V_{BGR}$ represents a Bandgap reference voltage which remains substantially constant, regardless of variations in temperature.

The net effect of Eq. (4) may be to shift away the theoretical zero-crossing point of the temperature compensating reference voltage ($V_{REF}$) from absolute zero temperature (0 Kelvin) towards higher temperatures. By controlling the amount of this shift, the temperature at which the temperature compensating reference voltage ($V_{REF}$) reaches zero as a function of temperature may be made to substantially match the zero crossing of the resistance of a metallic resistor on a semi-conductor chip as a function of temperature, thus enhancing the effectiveness of this compensating reference voltage ($V_{REF}$).

FIG. 1 is a block diagram of a temperature compensation circuit for generating a temperature compensating reference voltage. As illustrated in FIG. 1, a Bandgap reference circuit 101 may be configured to generate a Bandgap reference voltage ($V_{BGR}$) 102 that is substantially temperature independent. It may also be configured to generate a proportional-to-absolute-temperature reference voltage ($V_{PTAT}$) 105 that varies substantially in proportion to absolute temperature. Any type of Bandgap reference circuit may be used for this purpose.

An operational amplifier 103 may have a non-inverting input 107 connected to the Bandgap reference circuit 101 and, in particular, to $V_{PTAT}$ 105. The operational amplifier 103 may have an output 109 on which the temperature compensating reference voltage ($V_{REF}$) is based. The output 109 may be connected to an input 111 to a feedback circuit 113. Another input 115 to the feedback circuit 113 may be connected to the Bandgap reference circuit 101 and, in particular, to $V_{BGR}$ 102. An output 117 of the feedback circuit 113 may be connected to an inverting input 119 of the operational amplifier 103.

The feedback circuit 113 may be configured to form a weighted average of the Bandgap reference voltage $V_{BGR}$ 102 and the temperature compensating voltage $V_{REF}$ 109. The feedback circuit 113 may be configured so as to cause $V_{REF}$ to be substantially equal to $V_{PTAT}$ times a constant $k_1$, minus $V_{BGR}$ times a constant $k_2$. In other words, the feedback circuit 113 may be configured to cause the overall circuit that is illustrated in FIG. 1 to implement Eq. (4) above.

Figure 2:
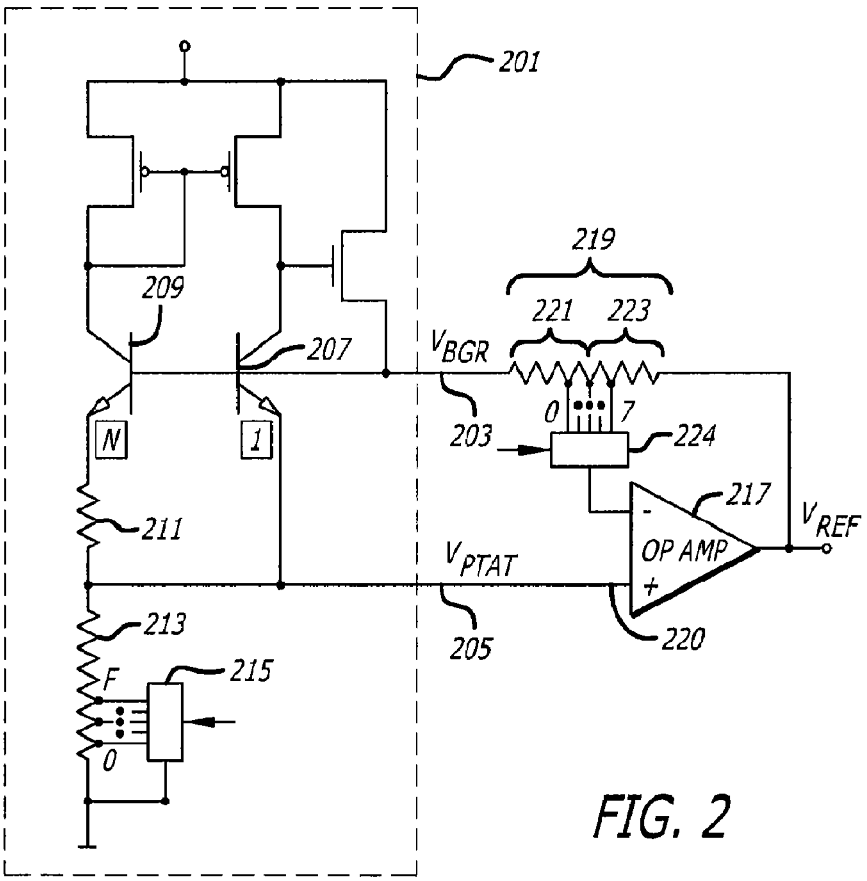
FIG. 2 is a schematic diagram of a temperature compensation circuit for generating a temperature compensating reference voltage.

FIG. 2 is a schematic diagram of a temperature compensation circuit for generating a temperature compensating reference voltage. It is an example of a type of circuit that may implement the block diagram illustrated in FIG. 1. Many other types of circuits may also implement the block diagram illustrated in FIG. 1.

As illustrated in FIG. 2, a Bandgap reference circuit 201 may generate a Bandgap reference voltage $V_{BGR}$ 203 which is substantially constant, regardless of fluctuations in temperature, as well as a proportional-to-absolute-temperature voltage $V_{PTAT}$ 205, which varies in proportion to absolute temperature. These aspects of the Bandgap reference circuit 201 may coincide with the corresponding aspects of the Bandgap reference circuit 101 in FIG. 1.

Any type of Bandgap reference circuit may be used for this purpose. The one illustrated in FIG. 2 for example, is a Bandgap reference circuit of the Brokaw type. The Brokaw type of Bandgap reference circuit may operate by taking advantage of a variation between the current density in the PN junction of a transistor 207 and the current density in the PN junctions of a transistor set 209, i.e., a set of transistors connected in parallel.

The transistor 207 and the members of the transistor set 209 may have substantially identical characteristics and may be driven with substantially identical currents through the use of a current mirror. The density difference may be controlled by the number of transistors which are used in the transistor set 209, indicated in FIG. 2 by the designation "N."

The Bandgap reference circuit 201 may effectively stack the base-to-emitter voltage of the transistor 207 on top of $V_{PTAT}$ 205 in order to generate $V_{BGR}$ 203. A string of resistors, such as a resistor 211 connected in series with a resistor 213, may be selected so as to scale $V_{PTAT}$ 205 to a desired amount. The magnitude of the resistor 213 may be adjusted by a trimming device 215 so as to enable the Bandgap reference circuit 201 to be set to its "magic voltage," i.e., the voltage at which $V_{BGR}$ 203 varies the least as a function of temperature.

The "magic voltage" for a particular Bandgap circuit may be determined empirically at a particular temperature, such as at room temperature. The "magic voltage" of all instances of the same Bandgap voltage reference circuit may be the same. Thus, once the "magic voltage" for a particular circuit has been determined, all replicas of this circuit may be optimally tuned by tuning them to this same voltage while at the same room temperature.

Any device may be used for the trimming device 215. When implemented on a silicon chip, the trimming device 215 may utilize trimming techniques such as polysilicon fusing, zener zap, a non-volatile memory, and/or any other type of tuning technique.

As illustrated in FIG. 2, the trimming device 215 may be set to tap the resistor 213 at any of sixteen hexadecimal values between zero and F. A different number of tap selections may be used instead.

An operational amplifier 217 may correspond to the operational amplifier 103 in FIG. 1. A string of resistors, such as a tapped resistor configuration 219, may be used as the feedback circuit 113 illustrated in FIG. 1. A trimming device 224 may be used to control the point of the tap on the tapped resistor configuration 219. The trimming device 224 may be of any type, such as one of the types discussed above in connection with the trimming device 215.

The tapped resistor configuration 219 may define a string of resistors, such as a resistor 221 effectively connected in series with a resistor 223. Alternatively, the string of resistors 221 and 223 may be separate resistors, with one of them having a tap that is controlled by the trimming device 224.

As illustrated in FIG. 2, the trimming device 224 may be set to tap the tapped resistor configuration 219 at any selectable integer value between zero and 7. A different number of tap selections may be provided instead.

The relationship between Eq. (4) and the circuit illustrated in FIG. 2 may be described by the following equation:

$$V_{REF}(T) = \left(1 + \frac{R_{223}}{R_{221}}\right) \cdot V_{PTAT} - \frac{R_{223}}{R_{221}} \cdot V_{BGR} \quad \text{(Eq. 5)}$$

By scaling the ratio of the resistor 223 to the resistor 221, and by scaling $V_{PTAT}$ appropriately by controlling the ratio of the resistor 211 to the resistor 213, the output of the operational amplifier 217, $V_{REF}$, may be scaled to effectively compensate for the temperature drift of most any type of metal resistor, such as resistors made of copper, aluminum and/or gold, as are commonly used as interconnects in integrated circuits.

Although the coefficients of $V_{PTAT}$ and $V_{BGR}$ in Eq. 5 appear to be related and hence dependent, they may be decoupled by connecting the non-inverting input 220 of the operational amplifier 217 to a suitable tap on the string of resistors 211 and 213, and/or by scaling up $V_{BGR}$. For the metals which have been described, however, this has been found to be unnecessary because the required ratio between the resistors 223 and 221 are typically less than 0.2, such as in the range from 0.04 to 0.1.

Although the non-inverting input to the operational amplifier 217 is illustrated in FIG. 2 as being connected to the node between the resistor 211 and the resistor 213, it may in other embodiments be connected directly to the emitters of the transistor set 209.

Changing the ratio of the resistors 223 and 221 may effectively change the gain of the operational amplifier 217, thus effectively controlling the scaling of the Bandgap reference voltage $V_{BGR}$ 203. In turn, this may effectively control the extrapolated temperature at which $V_{REF}$ may reach zero so as to coincide with the temperature at which the resistance of the metal resistor also reaches zero, thus enhancing the effectiveness of the temperature compensating reference voltage $V_{REF}$.

For Bandgap reference circuits in which the transistor set 209 consists of eight transistors, the "magic voltage" may be approximately 1.23 volts. In order to achieve this voltage, the ratio of the resistor 213 to the resistor 211 may need to be in the range of 5.19 to 5.52.

FIG. 3 is a table mapping settings of the trimming device 215 in the Bandgap reference circuit 201 to ratios of the resistor 213 to resistor 211 in the Bandgap reference circuit 201. It illustrates a set of ratio values which the trimming device 215 in conjunction with the selection of the resistors 211 and 213 may be configured to select. A circle 301 illustrates, for example, that an optimal setting of "7" for the trimming device 215 may yield for one embodiment of the circuit a ratio of 5.34 of the resistor 213 to resistor 211.

The needed ratio between the resistor 223 and the resistor 221, as fine-tuned by the trimming device 224, may depend upon the setting of the trimming device 215, in addition to the temperature characteristics of the metal resistor. To facilitate the trimming of the tapped resistor configuration 219 during large scale production, tables may be generated which set forth settings of the trimming device 224 based on temperature characteristics of the metal resistor for which compensation is needed and optimal trim settings of the trimming device 215. An illustrative set of such tables will now be discussed.

FIG. 4(*a*) is a table mapping temperature coefficient values of a metal resistor and settings of the trimming device 215 to settings of the trimming device 224 in the feedback circuit 113. The first column in the table is labeled "TC1 @ 300K [ppm/K]." This may represent the first order temperature coefficient of the metal resistor that has been determined from a Spice simulation. For example, a particular metal resistor may have a TC1 of 3900 ppm/K, as illustrated by a circle 401 around the row that represents this temperature coefficient value. Although not shown, the Debye temperature $T_{Debye}$ of the metal resistor may be listed in addition or instead of the column labeled "TC1 @ 300K [ppm/K]."

The remaining columns in the table list possible, "magic voltage" trim bit settings of the trimming device 215. After the trimming device 215 is set to generate the "magic voltage," as described above, the column representing this setting may be found on the table. A circle 403 illustrates an example of such a setting, in this case a setting of "7."

The cells at the intersection of each selected row and column may then contain the appropriate setting for the trimming device 224. In the example discussed above, this trim setting may be a "2."

FIG. 4(*b*) is a table mapping settings of the trimming device 224 in the feedback circuit 113 to ratios of the resistors 221 to 223. Following through with the example above, the row for the trim setting of "2" is highlighted by a circle 405, which points to a corresponding ratio of 13.42.

Figure 5:
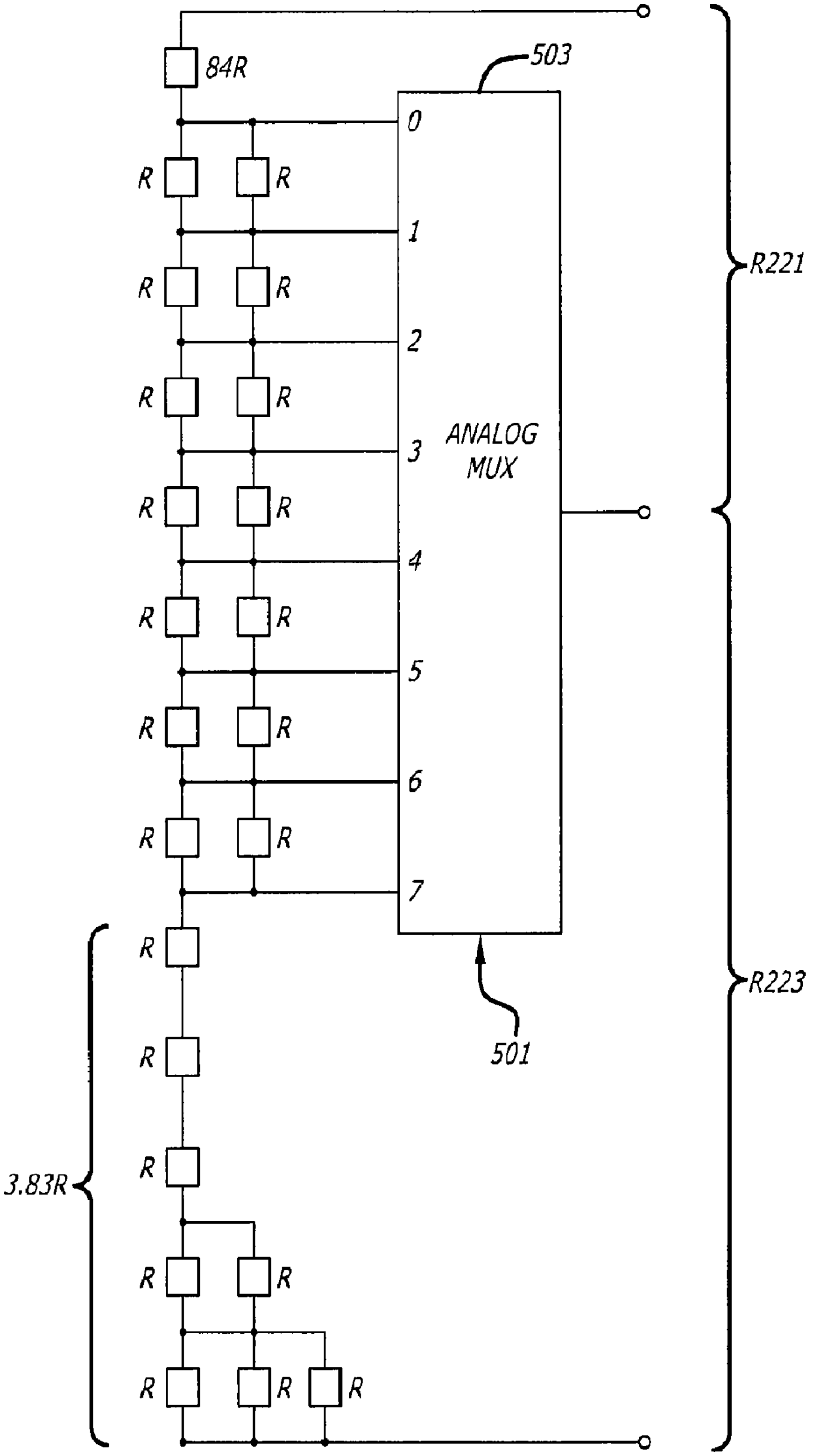
FIG. 5 is a circuit configured to generate selectable resistance ratio values.

FIG. 5 is a circuit configured to generate selectable resistance ratio values. The trim setting that has been identified in FIG. 4(*a*) may be applied at an input 501 to an analog multiplexer 503 so as to generate the correct values for the resistors 221 and 223, consistent with the ratio values that are desired as set forth in FIG. 4(*b*). To enable the analog multiplexer 503 to accomplish this, fixed resistances having a value of "R" may be connected to the analog multiplexer 503, as illustrated in FIG. 5.

The values that are set forth in FIGS. 3, 4(*a*) and 4(*b*), as well as the circuit which is shown in FIG. 5, are merely examples. In other configurations, the values and the circuit may be much different.

The metal resistor for which the temperature compensating reference voltage $V_{REF}$ has been generated in connection with the circuits illustrated in FIGS. 1 and 2 may be used for any purpose. For example, the metal resistor may be used to sense an operational parameter and may be located within a semiconductor chip. One such operational parameter which the metal resistor may be configured to sense is the charge which is being delivered to a battery in connection with a battery charger and/or which is being removed from the battery while the battery is serving as a source of energy.

Figure 6:
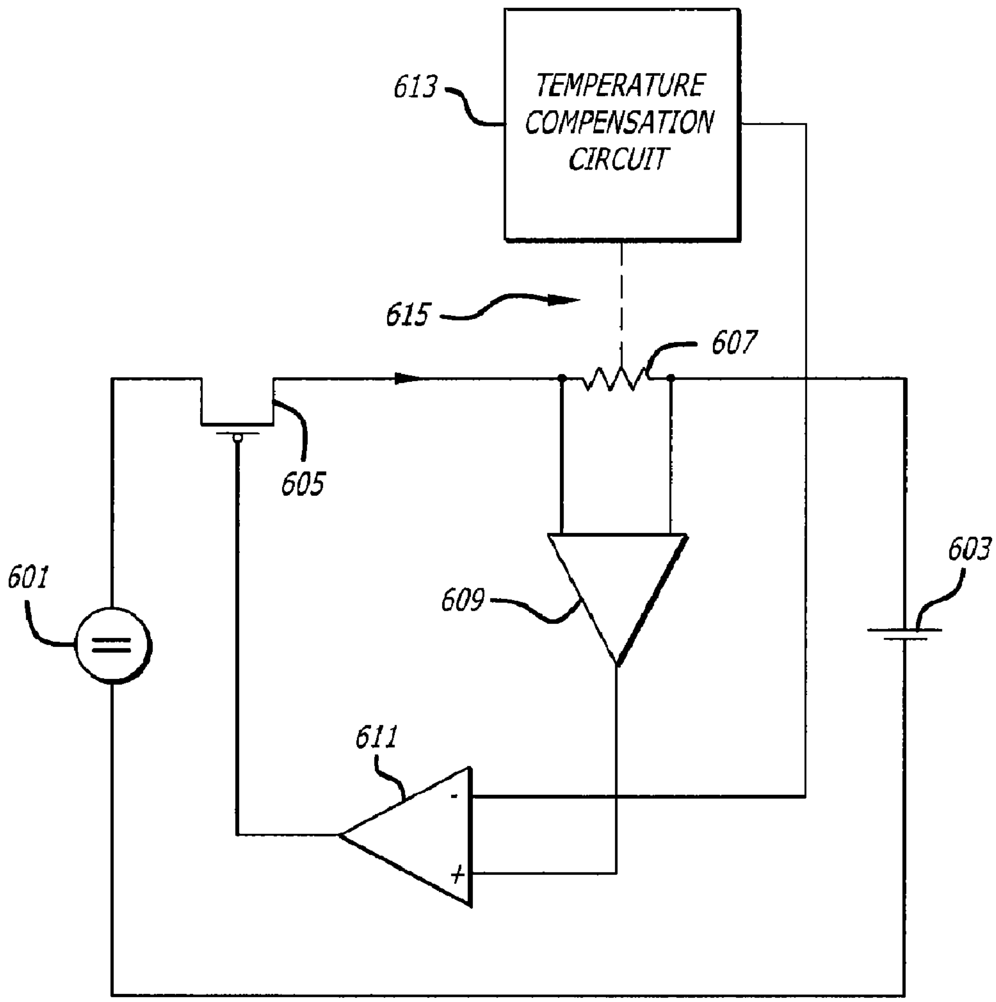
FIG. 6 is a diagram of a temperature compensation reference voltage circuit integrated with a battery charger.

FIG. 6 is a diagram of a temperature compensation reference voltage circuit integrated with a battery charger. As illustrated in FIG. 6, a source of voltage 601 may be configured to charge a battery 603. The charging current may be regulated by a p-type MOSFET 605 and sensed by a metal sensing resistor 607. The voltage across the metal sensing resistor 607 may be amplified by an amplifier 609 and compared by an operational amplifier 611 to a temperature compensating reference voltage from a temperature compensation circuit 613. The result of the comparison may be used to control the gate of the p-type MOSFET 605, thus effectuating regulation of the charging current.

With the exception of the source of energy 601 and the battery 603, all of the components illustrated in FIG. 6 may be on the same silicon chip.

The temperature compensation circuit 613 may be of any type, such as one of the circuits illustrated in FIG. 1 and/or FIG. 2, as discussed above. The temperature compensation circuit 613 may be configured to generate a reference voltage that changes as a function of temperature in proportion to changes in the resistance of the metal sensing resistor 607, using tuning techniques, such as those discussed above in connection with FIGS. 1 and 2.

A thermal coupling 615 may thermally couple critical, temperature-sensitive components of the temperature compensation circuits 613, such as the transistor 207 and the transistor set 209 illustrated in FIG. 2, to the metal sensing resistor 607. This may ensure that the temperature compensating reference voltage that is generated by the temperature compensation circuit 613 faithfully tracks changes in the resistance of the metal sensing resistor 607 as a function of change in the temperature of the metal sensing resistor 607. Variations of this design, as should now be apparent, may be adapted to current limiting in linear and switch mode voltage regulators.

Figure 7:
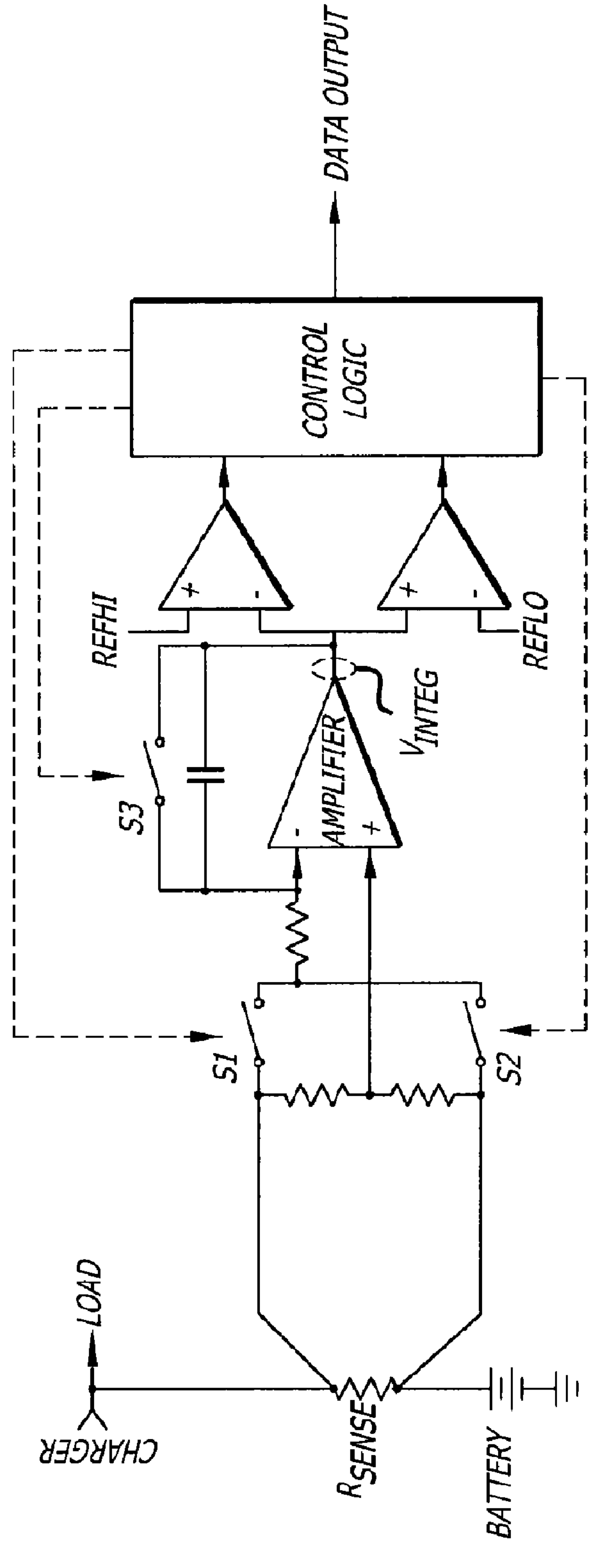
FIG. 7 Prior Art
FIG. 7 is a diagram of a ping-pong type coulomb counter.

FIG. 7 is a diagram of the ping-pong type coulomb counter currently implemented by Linear Technology Corporation component LTC4150. As is well known, a coulomb counter maintains a count representative of the total charge in a battery. It does so by tracking the charge which is delivered to and removed from the battery. The circuit operates by integrating the current which is measured by a sensing resistor, indicated in FIG. 7 as $R_{SENSE}$, and by converting that integrated value to an integer count of the charge.

Figure 8:
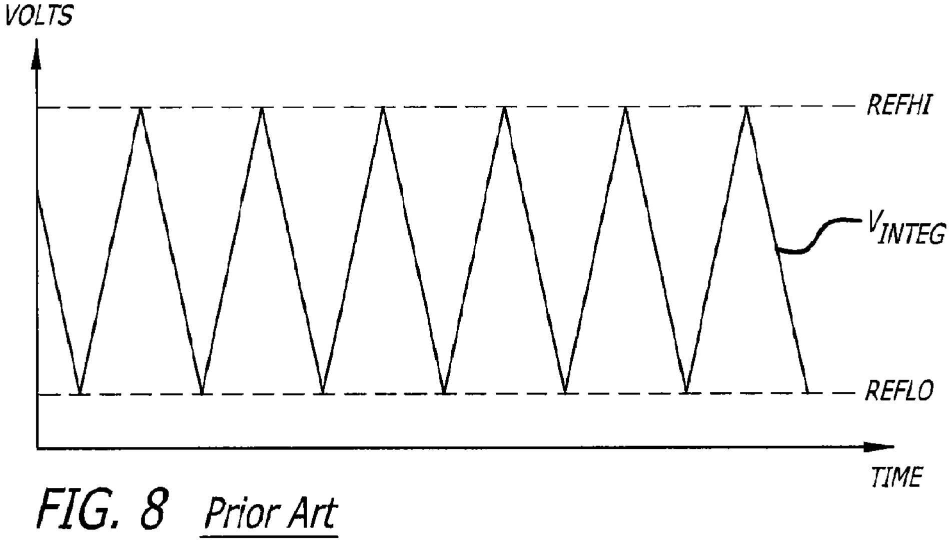
FIG. 8 Prior Art
FIG. 8 is a timing diagram of an integrated signal in the ping-pong type coulomb counter illustrated in FIG. 7.

Coulomb counters of this type may make use of a high and low reference voltage, designated in FIG. 7 as REFHI and REFLO. These voltages may be used to set the points at which the integration reverses, as illustrated in FIG. 8. These thresholds, in turn, may effect the granularity of the count.

Figure 9:
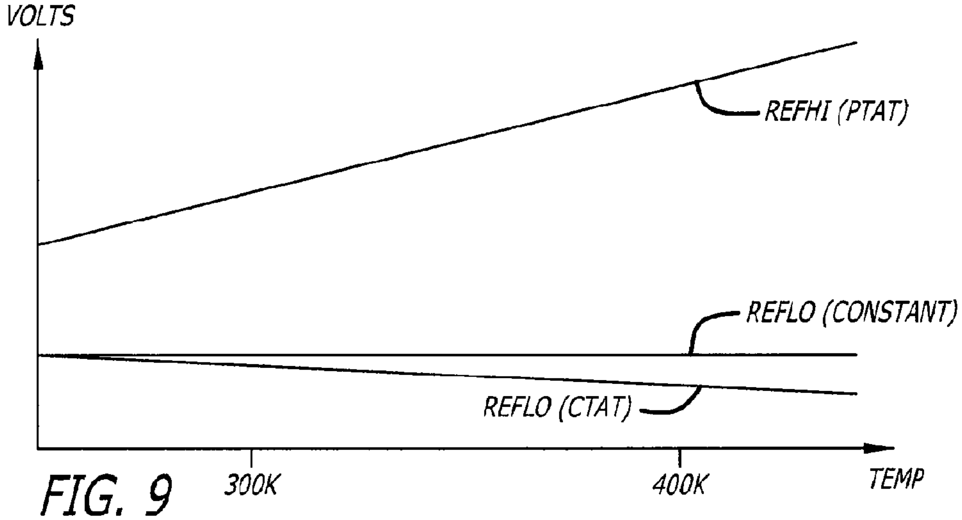
FIG. 9 illustrates temperature compensated signals that may be applied to the ping-pong type coulomb counter illustrated in FIG. 7.

The circuit which is illustrated in FIG. 7 is designed to have $R_{SENSE}$ be external to the semiconductor chip. However, $R_{SENSE}$ may instead be placed within the semiconductor chip in a different embodiment. In this configuration, compensation for changes in the value of $R_{SENSE}$ as a function of temperature may be provided by using a PTAT voltage for REFHI, as illustrated in FIG. 9. Compensation for changes in the value of $R_{SENSE}$ as a function of temperature may also or instead be provided by using a constant voltage or a complementary-to-absolute temperature ("CTAT") voltage for REFLO, as illustrated in FIG. 9.

The temperature compensation circuit, such as one of the circuits illustrated in FIGS. 1 and 2 and discussed above, may advantageously be used to effectuate temperature compensation when the sensing resistor in a coulomb counter is moved onto the silicon chip.

Figure 10:
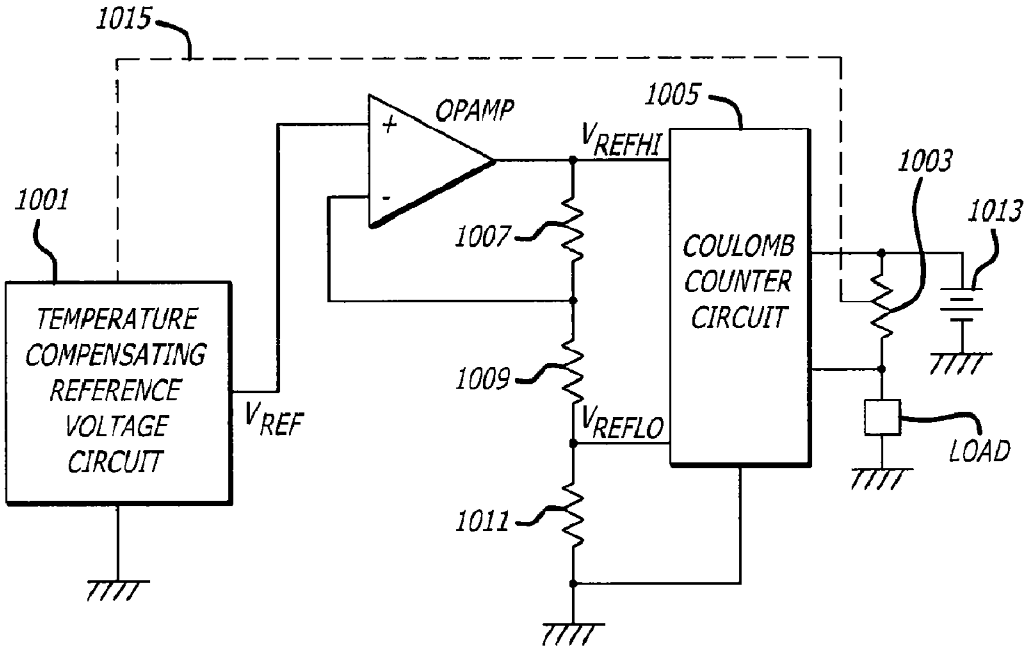
FIG. 10 is a diagram of a temperature compensation reference voltage circuit integrated with a coulomb counter.

FIG. 10 is a diagram of a temperature compensation reference voltage circuit integrated with a coulomb counter. As illustrated in FIG. 10, a temperature compensation circuit 1001 may be thermally coupled to a metal resistor 1003 which functions as a sensing resistor in a coulomb counter 1005 for the charge and discharge of battery 1013.

The temperature compensation circuit 1001 may be any of the types discussed above in connection with FIGS. 1 and 2. The temperature-sensitive portions of this circuit, such as the transistor 207 and the transistor set 209 illustrated in FIG. 2, may be thermally coupled to the metal resistor 1003 by a thermal coupling 1015. The output of the temperature compensation circuit 1001 may be scaled into appropriate values for the $V_{REFHI}$ and $V_{REFLO}$ that are required for the coulomb counter 1005, such as the REFHI and REFLO that are required in the coulomb counter illustrated in FIG. 7. This may be done by using an appropriate ladder network of resistors, such as resistors 1007, 1009, and 1011. All of the components which are illustrated in FIG. 10 may be contained on the same silicon chip, with the exception, of course, of the battery 1013.

The effectiveness of a temperature compensating reference voltage $V_{REF}$ may be enhanced by strong thermal coupling between the metal resistor and the temperature-sensitive portions of the temperature compensation circuit. To accomplish this, heat-spreading structures may be provided in the layout of the metal resistor. These structures may be arranged such that the electrical current flowing through the heat spreading structures is zero or at least low compared to the total current flowing in the main current paths through the resistor.

Figure 11:
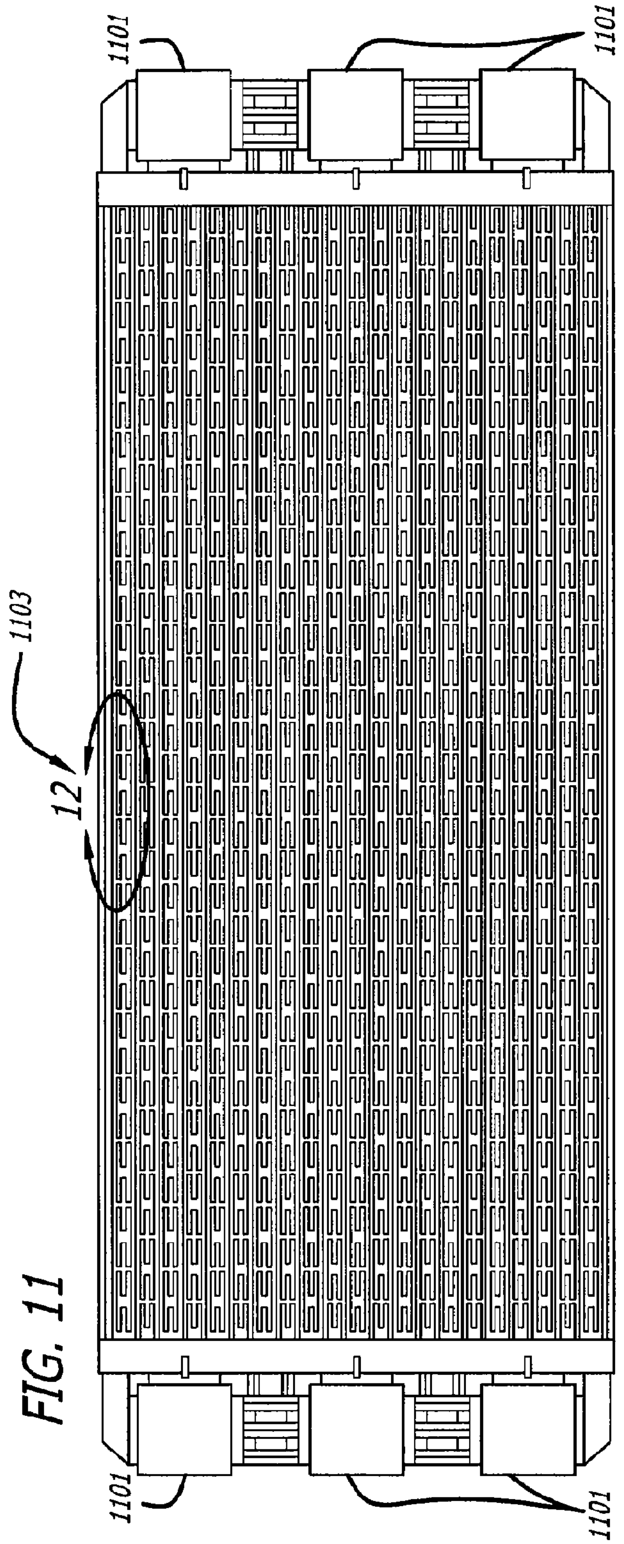
FIG. 11 illustrates a foil pattern for a metal resistor in a semiconductor chip.

FIG. 11 illustrates a foil pattern for a metal resistor in a semiconductor chip. As illustrated in FIG. 11, one or more bonding pads 1101 may be used to connect the metal resistor into a circuit. Between the bonding pad may lie a series of parallel metal lines which collectively serve to carry the current between the bonding pads 1101 on both sides of the resistor. The resistance of the metal resistor may be controlled by varying the number and width of these metal lines. Resistances in the area of about 50 milliohms may be typical.

Figure 12:
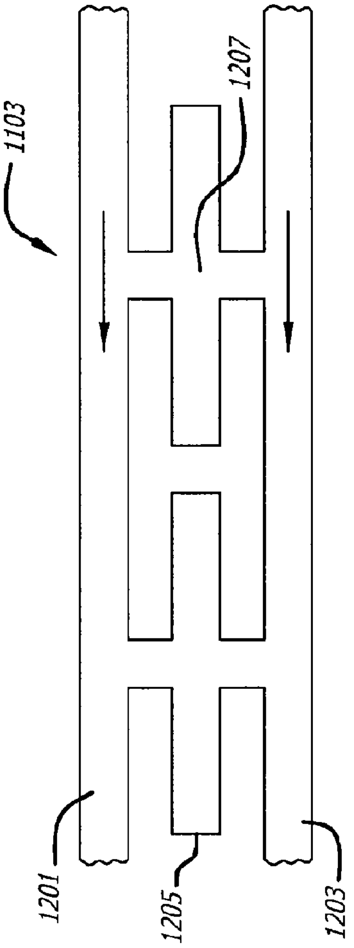
FIG. 12 illustrates an enlarged section of the foil pattern illustrated in FIG. 11.

FIG. 12 illustrates an enlarged section 1103 of the foil pattern illustrated in FIG. 11. As illustrated in FIG. 12, the foil pattern may include current-carrying portions 1201 and 1203 and non-current-carrying portions 1205 and 1207. Non-current-carrying portions may advantageously improve thermal coupling 615 between the metal resistor and the temperature-sensitive components of the temperature compensation circuit.

The non-current-carrying portions may be of any shape. For example, and as illustrated in FIG. 12, they may be substantially rectangular and may be connected across points of the current-carrying portions which are likely to be at the same voltage potential, thus ensuring that current does not travel through them. At the same time, the non-current-carrying portions may represent a sizeable portion of the total surface area of the metal resistor and may be uniformly distributed throughout it. Although illustrated in FIG. 12 as being substantially rectangular, the non-current-carrying portions may be of any other shape.

The temperature compensating reference voltage circuit may be placed above or beneath the metal resistor to be compensated. For some applications, such as when the metal resistor acts as a current sense resistor in a switching power supply or a coulomb counter, electrical interference from the AC components of the sensed current may couple into sensitive nodes of the temperature compensation circuit. An electrostatic ("Faraday") shield may be placed between the metal resistor and the temperature compensation circuit to help reduce this interference.

Figure 13:
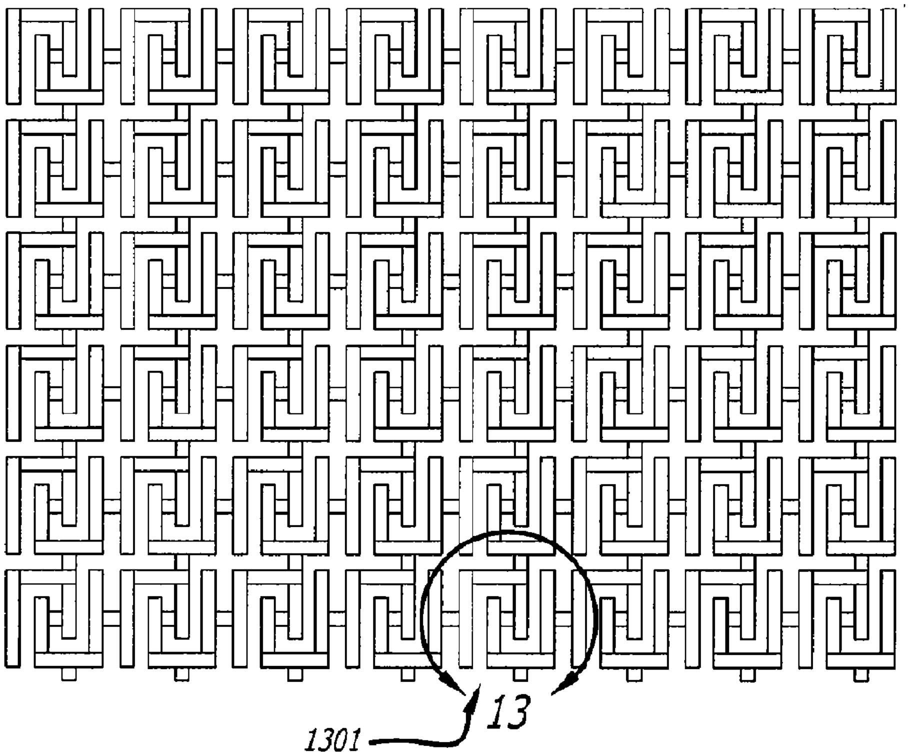
FIG. 13 illustrates a configuration for an electrostatic shield.
Figure 14:
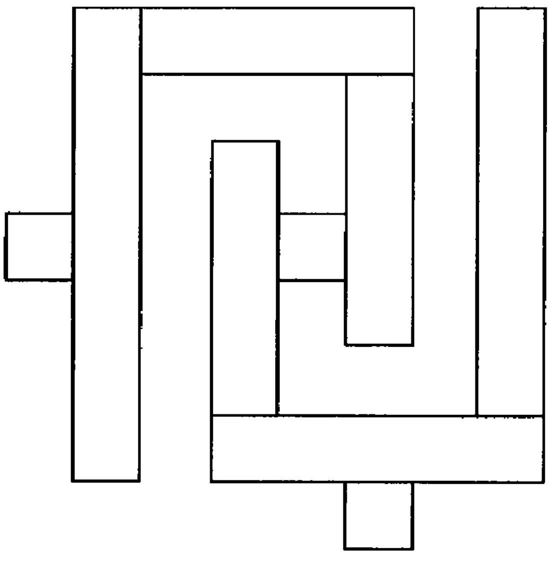
FIG. 14 illustrates an enlarged view of a sub-element in FIG. 13.

Using a solid metal plate for this shield may cause great mechanical stress and impair matching of critical transistors, possibly interfering with the precision of the circuit. FIG. 13 illustrates a different configuration for an electrostatic shield. FIG. 14 illustrates an enlarged view of a sub-element 1301 in FIG. 13. The electrostatic shield may be made of a conducting metal, such as aluminum. As illustrated in FIGS. 13 and 14, the electrostatic shield may include a pattern of metal foil that substantially spans across a surface, but that has no unbroken linear path of metal foil that also spans fully across that surface.

The pattern of metallic foil may include a matrix of interconnected sub-elements, such as sub-element 1301. The pattern of metal foil in the sub-elements may be such that a set of sub-elements may be arranged in such a way that no unbroken linear path of metal spans the set of sub-elements. Although a maze-like pattern based on two interlocked U-shaped metal foil runs is illustrated in FIGS. 13 and 14, a wide variety of other types of patterns may be used in addition or instead. Although the pattern illustrated in FIGS. 13 and 14 consist of a set of rectangular foil segments joined at right angles to one another, segments of different shapes may be used and may be joined at different angles, not all of which may be of the same amount.

The electrostatic shield may be made by any process. For example, in a three-metal layer process, the temperature compensation circuit may use metal one and polysilicon as interconnect, while metal two may be used for the shield, and metal three may be used for the sense resistor. Other types of configurations and approaches may be used in addition or instead.

The components, steps, features, objects, benefits and advantages that have been discussed are merely illustrative. None of them, nor the discussions relating to them, are intended to limit the scope of protection in any way. Numerous other embodiments are also contemplated, including embodiments that have fewer, additional, and/or different components, steps, features, objects, benefits and advantages. The components and steps may also be arranged and ordered differently.

For example, a switched capacitor circuit may be used in lieu of or in addition to the resistor network illustrated in FIG. 2 for the feedback circuit 113 illustrated in FIG. 1.

The temperature compensation circuit may employ a single PN junction or a single transistor as its temperature sensitive portion, which then may be operated sequentially at least two different current levels, and the difference of the voltages at the single PN junction between the at least two different current levels being amplified to yield a PTAT voltage and the PTAT voltage further being added to the PN junction voltage to yield a bandgap dependent reference voltage that is substantially constant over temperature.

The amplification and adding operations in such a temperature compensating reference circuit may be effected by a switched capacitor circuit. The switched capacitor circuit may be configured to develop the temperature compensating reference voltage according to Eq. 4 directly by adding k1 times a PTAT voltage ($V_{PTAT}$) component and then subtracting k2 times a bandgap dependent voltage ($V_{BGR}$) component which is substantially constant over temperature. The adding and subtracting operations in such a switched capacitor circuit may interleaved in time. The multiplicative coefficients k1 and k2 may be implemented by a corresponding number of addition and subtraction operations or by scaling capacitor ratios, or both.

The trimming procedure of a switched capacitor based implementation of the temperature compensation circuit may comprise the steps of determining a first trim value which minimizes the variation of a bandgap dependent voltage on temperature, and using the first trim value and a temperature characteristic of the metal resistor to determine a second trim value which is used to set trimming means of a temperature compensation circuit such that its output voltage Vref is a PTAT voltage times a constant k1 minus a bandgap dependent voltage times a constant k2.

The sense resistor may use any non-rectangular geometries, in example, a honeycomb like structure for the current-carrying portions and inside of the honeycomb cells having non-current-carrying portions of polygonal or circular shape connected to the current-carrying portions at only one section of the polygonal or circular shape's perimeter, such that no substantial current may flow through the non-current-carrying portions. A sense resistor having current-carrying portions and non-current-carrying portions also may be formed by providing "U"-shaped slots in an otherwise solid metal plate, the remaining metal in the interior of the "U" being the non-current-carrying portions. Instead of the "U"-shape, any suitable slot shape yielding non-current-carrying portions may be used. The electrostatic shield may be composed of a matrix of sub-elements which are not alike.

The term "coupled" encompasses both direct and indirect coupling. For example, the term "coupled" encompasses the presence of intervening circuitry between two points that are coupled.

The phrase "means for" when used in a claim embraces the corresponding structures and materials that have been described and their equivalents. Similarly, the phrase "step for" when used in a claim embraces the corresponding acts that have been described and their equivalents. The absence of these phrases means that the claim is not limited to any of the corresponding structures, materials, or acts or to their equivalents.

Nothing that has been stated or illustrated is intended to cause a dedication of any component, step, feature, object, benefit, advantage, or equivalent to the public, regardless of whether it is recited in the claims.

In short, the scope of protection is limited solely by the claims that now follow. That scope is intended to be as broad as is reasonably consistent with the language that is used in the claims and to encompass all structural and functional equivalents.

What is claimed is:

1. A temperature compensation circuit for generating a temperature compensating reference voltage ($V_{REF}$) used to compensate for temperature drift of a metal resistor comprising:

a Bandgap reference circuit configured to generate a Bandgap reference voltage ($V_{BGR}$) that is substantially temperature independent and a proportional-to-absolute-temperature reference voltage ($V_{PTAT}$) that varies substantially in proportion to absolute temperature;

an operational amplifier that is connected to the Bandgap reference circuit and that has an output on which $V_{REF}$ is based; and a feedback circuit that is connected to the operational amplifier and to the Bandgap reference circuit and that is configured so as to cause $V_{REF}$ to be substantially equal to $V_{PTAT}$ times a constant $k_1$, minus $V_{BGR}$ times a constant $k_2$, and wherein at least one of the following:

the feedback circuit includes a string of resistors having two ends and a node between two resistors in the string; the constant $k_2$ is a function of the resistances of the resistors in the string; the feedback circuit has a trimming device configured to allow the ratio of the two resistors to be adjusted; the ratio of the resistors in the string has been adjusted so as to maximize the ability of $V_{REF}$ to compensate for variations in the resistance of a particular metal resistor on a particular semiconductor chip as a function of temperature; and the Bandgap reference circuit includes a PN junction connected to a string of resistors having a node between two resistors in the string and wherein the non-inverting input of the opamp is connected to the node;

the Bandgap reference circuit is of the Brokaw type;

the feedback circuit includes a switched capacitor circuit; or the Bandgap reference circuit is configured to stack a base-to-emitter voltage on top of a $V_{PTAT}$ voltage to generate a bandgap reference voltage $V_{BGR}$ a non-inverting input of the operational amplifier is coupled to a $V_{PTAT}$ voltage, the feedback circuit is coupled to $V_{BGR}$ and the output of the operational amplifier, the feedback circuit is configured to develop a weighted average voltage of $V_{BGR}$ and the output of the operational amplifier and an inverting input of the operational amplifier is coupled to the weighted average voltage.

2. The temperature compensation circuit of claim 1 wherein the feedback circuit includes a string of resistors having two ends and a node between two resistors in the string.

3. The temperature compensation circuit of claim 2 wherein the constant $k_2$ is a function of the resistances of the resistors in the string.

4. The temperature compensation circuit of claim 3 wherein the feedback circuit has a trimming device configured to allow the ratio of the two resistors to be adjusted.

5. The temperature compensation circuit of claim 4 wherein the ratio of the resistors in the string has been adjusted so as to maximize the ability of $V_{REF}$ to compensate for variations in the resistance of a particular metal resistor on a particular semiconductor chip as a function of temperature.

6. The temperature compensation circuit of claim 5 wherein the Bandgap reference circuit includes a PN junction connected to a string of resistors having a node between two resistors in the string and wherein the non-inverting input of the opamp is connected to the node.

7. The temperature compensation circuit of claim 6 wherein the constant $k_1$ is a function of the resistances of the resistors in the Bandgap reference circuit.

8. The temperature compensation circuit of claim 7 wherein the Bandgap reference circuit includes a trimming device configured to trim the resistance of one of the resistors in the Bandgap reference circuit.

9. The temperature compensation circuit of claim 8 wherein the resistance of one of the resistors in the Bandgap reference circuit has been trimmed to a setting to minimize the dependence of $V_{BGR}$ on temperature and wherein the resistance of one of the resistors in the feedback circuit has been trimmed based on the setting of the trimming device in the Bandgap circuit.

10. The temperature compensation circuit of claim 6 wherein the Bandgap reference circuit includes a second PN junction and wherein the second PN junction is also connected to the node between two resistors in the Bandgap reference circuit.

11. The temperature compensation circuit of claim 2 wherein one end of the string of resistors is connected to the Bandgap reference circuit, the other end is connected to output of the operational amplifier, and the node between two resistors in the string is connected to an input of the operational amplifier.

12. The temperature compensation circuit of claim 11 wherein the operational amplifier has an inverting input, the node between two resistors in the string is connected to the inverting input, and one end of the string of resistors is connected to $V_{BGR}$.

13. The temperature compensation circuit of claim 1 wherein the operational amplifier has a non-inverting input and wherein the non-inverting input is connected to the Bandgap reference circuit.

14. The temperature compensation circuit of claim 13 wherein the non-inverting input of the operational amplifier is connected to $V_{PTAT}$.

15. The temperature compensation circuit of claim 1 wherein the Bandgap reference circuit is of the Brokaw type.

16. The temperature compensation circuit of claim 1 wherein the feedback circuit includes a switched capacitor circuit.

17. The temperature compensation circuit of claim 1 wherein the Bandgap reference circuit is configured to stack a base-to-emitter voltage on top of a $V_{PTAT}$ voltage to generate a bandgap reference voltage $V_{BGR}$, a non-inverting input of the operational amplifier is coupled to a $V_{PTAT}$ voltage, the feedback circuit is coupled to $V_{BGR}$ and the output of the operational amplifier, the feedback circuit is configured to develop a weighted average voltage of $V_{BGR}$ and the output of the operational amplifier, and an inverting input of the operational amplifier is coupled to the weighted average voltage.

18. A temperature-compensated semiconductor chip comprising:

a metal resistor within the semiconductor chip; and a temperature compensation circuit within the semiconductor chip configured to generate a temperature compensating reference voltage ($V_{REF}$) that substantially compensates for variations in the resistance of the metal resistor as a function of temperature, which temperature compensation circuit includes:

a Bandgap reference circuit thermally-coupled to the metal resistance and configured to generate a Bandgap reference voltage ($V_{BGR}$) that is substantially temperature independent and a proportional-to-absolute-temperature reference voltage ($V_{PTAT}$) that varies substantially in proportion to absolute temperature;

an operational amplifier that is connected to the Bandgap reference circuit and that has an output on which $V_{REF}$ is based; and a feedback circuit that is connected to the operational amplifier and to the Bandgap reference circuit and that is configured so as to cause $V_{REF}$ to be substantially equal to $V_{PTAT}$ times a constant $k_b$, minus $V_{BGR}$ times a constant $k_2$, wherein at least one of the following:

the metal resistor has two connection nodes and a pattern of metal foil between the two connection nodes that includes current-carrying portions which are configured to conduct current between the two nodes and non-current-carrying portions which are configured not to conduct current between the nodes;

an electrostatic shield is placed between the metal resistor and the temperature compensation circuit; or the metal resistor is configured within the semiconductor chip to sense an operational parameter.

19. The temperature-compensated semiconductor chip of claim 18 wherein the metal resistor has two connection nodes and a pattern of metal foil between the two connection nodes that includes current-carrying portions which are configured to conduct current between the two nodes and non-current-carrying portions which are configured not to conduct current between the nodes.

20. The temperature-compensated semiconductor chip of claim 19 wherein the Bandgap reference circuit is thermally-coupled to the non-current-carrying portions of the metal foil.

21. The temperature-compensated semiconductor chip of claim 19 wherein the non-current-carrying portions of the metal foil are distributed substantially throughout the current-carrying portions of the foil.

22. The temperature-compensated semiconductor chip of claim 19 wherein the non-current-carrying portions of the metal foil are connected across current-carrying portions at positions that will be a substantially equal potential when current is passed through the metal resistor.

23. The temperature-compensated semiconductor chip of claim 18 wherein an electrostatic shield is placed between the metal resistor and the temperature compensation circuit.

24. The temperature-compensated semiconductor chip of claim 23 wherein the electrostatic shield comprises a pattern of metal foil that substantially spans across a surface but that has no unbroken linear path of metal foil that spans fully across the surface.

25. The temperature-compensated semiconductor chip of claim 23 wherein the electrostatic shield comprises a matrix of interconnected sub-elements, each sub-element comprising a pattern of metal foil that is shaped such that a set of sub-elements may be arranged in such a way that their metal foil is electrically interconnected but no unbroken linear path of metal foil spans the set of sub-elements.

26. The temperature-compensated semiconductor chip of claim 23 wherein the electrostatic shield comprises a matrix of interconnected sub-elements, each sub-element comprising at least two interlocking U-shaped metal foil components electrically connected by at least one further metal foil component.

27. The temperature-compensated semiconductor chip of claim 18 wherein the metal resistor is configured within the semiconductor chip to sense an operational parameter.

28. The temperature-compensated semiconductor chip of claim 27 wherein the metal resistor is configured to sense an amount of charge that is being delivered to or removed from a battery.

29. The temperature-compensated semiconductor chip of claim 27 wherein the metal resistor is configured to sense an amount of current that is being delivered to a battery during charging of that battery.

30. A process for trimming a semiconductor chip to compensate for anticipated variations in the resistance of a metal resistor that is within the semiconductor chip as a function of temperature, the semiconductor chip also including an operational amplifier and a feedback circuit with a trimming device that is connected to the operational amplifier, the process comprising:

trimming the trimming device in the feedback circuit so as to maximize the ability of a reference voltage ($V_{REF}$) to compensate for variations in the resistance of the metal resistor as a function of temperature, wherein at least one of the following:

the semiconductor chip also includes a Bandgap reference circuit that includes a trimming device and further comprising trimming the trimming device in the Bandgap reference circuit so as to minimize the dependence of a Bandgap reference voltage ($V_{BGR}$) on temperature; and the trimming of the trimming device in the Bandgap reference circuit results in the selection of a trim setting and wherein the trimming of the trimming device in the feedback circuit is based on the trim setting which is selected for the trimming device in the Bandgap reference circuit; or the trimming the trimming device causes $V_{REF}$ to have an extrapolated voltage of zero at substantially the same temperature as the metal resistor has an extrapolated resistance of zero.

31. The process of claim 30 wherein the semiconductor chip also includes a Bandgap reference circuit that includes a trimming device and further comprising trimming the trimming device in the Bandgap reference circuit so as to minimize the dependence of a Bandgap reference voltage ($V_{BGR}$) on temperature.

32. The process of claim 31 wherein the trimming of the trimming device in the Bandgap reference circuit results in the selection of a trim setting and wherein the trimming of the trimming device in the feedback circuit is based on the trim setting which is selected for the trimming device in the Bandgap reference circuit.

33. The process of claim 32 wherein the trimming of the trimming device in the feedback circuit is also based on a temperature characteristic of the metal resistor that relates to its temperature dependence.

34. The process of claim 33 wherein the physical property of the metal resistor is its Debye Temperature.

35. The process of claim 33 wherein the physical property of the metal resistor is a first order temperature coefficient.

36. The process of claim 30 wherein the trimming the trimming device causes $V_{REF}$ to have an extrapolated voltage of zero at substantially the same temperature as the metal resistor has an extrapolated resistance of zero.

* * * * *